(12) United States Patent
Honda

(10) Patent No.: US 7,586,186 B2
(45) Date of Patent: Sep. 8, 2009

(54) BALL GRID ARRAY

(75) Inventor: Takayoshi Honda, Kariya (JP)

(73) Assignee: Denso Corporation, Kariya, Aichi-Pref. (JP)

( * ) Notice: Subject to any disclaimer, the term of this patent is extended or adjusted under 35 U.S.C. 154(b) by 0 days.

(21) Appl. No.: 11/656,431

(22) Filed: Jan. 23, 2007

(65) Prior Publication Data

US 2007/0170587 A1 Jul. 26, 2007

(30) Foreign Application Priority Data

Jan. 24, 2006 (JP) ............................ 2006-015623

(51) Int. Cl.
*H01L 23/52* (2006.01)
(52) U.S. Cl. .................. 257/691; 257/690; 257/693; 257/734; 257/773; 257/776; 257/E23.067; 257/E23.069; 257/E23.079
(58) Field of Classification Search ................ 257/690, 257/691, 693, 673, 734, 778, 697, 698, 735, 257/773, 776, 780, 786, E23.067–E23.069, 257/E23.079
See application file for complete search history.

(56) References Cited

U.S. PATENT DOCUMENTS

| | | | | |
|---|---|---|---|---|
| 6,008,534 | A * | 12/1999 | Fulcher .................. | 257/691 |
| 6,700,207 | B2 * | 3/2004 | Pekin et al. ............. | 257/778 |
| 6,747,352 | B1 | 6/2004 | Huemoeller et al. | |
| 2003/0102536 | A1 | 6/2003 | Barre et al. | |
| 2004/0256717 | A1 | 12/2004 | Suenaga et al. | |

FOREIGN PATENT DOCUMENTS

| | | |
|---|---|---|
| EP | 0 814 511 | 12/1997 |
| JP | 08-102507 | 4/1996 |
| JP | 10-041426 | 2/1998 |
| JP | 10-056102 | 2/1998 |
| JP | 10-074802 | 3/1998 |
| JP | 11-251727 | 9/1999 |
| JP | 11-274237 | 10/1999 |
| JP | 11-297879 | 10/1999 |
| JP | 11-307684 | 11/1999 |
| JP | 2001-203435 | 7/2001 |
| JP | 2002-043466 | 2/2002 |
| JP | 2002-359260 | 12/2002 |
| JP | 2003-283081 | 10/2003 |
| JP | 2004-111863 | 4/2004 |

OTHER PUBLICATIONS

Extended European Search Report dated Aug. 4, 2008 in EP 07000694.5.

* cited by examiner

*Primary Examiner*—Jasmine J Clark
(74) *Attorney, Agent, or Firm*—Nixon & Vanderhye PC

(57) ABSTRACT

A ball grid array includes: a semiconductor chip having multiple pads; and an interposer for mounting the semiconductor chip on a first surface. The interposer includes multiple wirings on the first surface and multiple ball terminals on a second surface opposite to the first surface. Each wiring is connected to a corresponding pad of the semiconductor chip, and is electrically connected to a corresponding ball terminal. At least one of ball terminals providing a power supply terminal or a ground terminal provides a common ball terminal for connecting to at least two of the pads of the semiconductor chip through two wirings.

19 Claims, 5 Drawing Sheets

BALL GRID ARRAY

CROSS REFERENCE TO RELATED APPLICATION

This application is based on Japanese Patent Application No. 2006-15623 filed on Jan. 24, 2006, the disclosure of which is incorporated herein by reference.

FIELD OF THE INVENTION

The present invention relates to a ball grid array.

BACKGROUND OF THE INVENTION

One example of conventional ball grid arrays is disclosed in JP-A-2004-111863. In the ball grid array, a plurality of semiconductor chips are mounted on one plane of an interposer, and solder balls functioning as ball terminals are arranged on the other plane of this interposer.

There are some cases that the above-described plural semiconductor chips are equipped with terminals for common functions, for instance, reset terminals related to serial communications and an oscillator of a microcomputer; terminals related to a power supply; A/D input terminals; terminals for input ports; test terminals, and the like. Accordingly, since the terminals for the common functions of the plural semiconductor chips are connected to common solder balls, a total number of these solder balls required to connect the ball grid array may be reduced so as to make the ball grid array compact.

However, the above-described ball grid array is employed where plural semiconductor chips are mounted on a common board. In other words, in the case that a single semiconductor chip is mounted on the interposer, this approach has not reduced the number of solder balls.

Thus, it is still desirable to provide a ball grid array which can be applied to such a case that a single semiconductor chip is mounted on an interposer, and which can be made compact, while a total number of ball terminals used to connect the ball grid array can be reduced.

SUMMARY OF THE INVENTION

In view of the above-described problem, it is an object of the present disclosure to provide a ball grid array.

According to an aspect of the present disclosure, a ball grid array includes: a semiconductor chip having a plurality of pads; and an interposer for mounting the semiconductor chip on a first surface of the interposer. The interposer includes a plurality of wirings disposed on the first surface and a plurality of ball terminals disposed on a second surface, which is opposite to the first surface. Each wiring is connected to a corresponding pad of the semiconductor chip, and is electrically connected to a corresponding ball terminal. At least one of ball terminals providing a power supply terminal or a ground terminal provides a common ball terminal for connecting to at least two of the pads of the semiconductor chip through two wirings.

In the above array, a total number of the ball terminals can be decreased, as compared with a total number of the pads of the semiconductor chip, so that the ball grid array can be made compact.

BRIEF DESCRIPTION OF THE DRAWINGS

The above and other objects, features and advantages of the present invention will become more apparent from the following detailed description made with reference to the accompanying drawings. In the drawings.

DETAILED DESCRIPTION OF THE PREFERRED EMBODIMENTS

Figure 1:
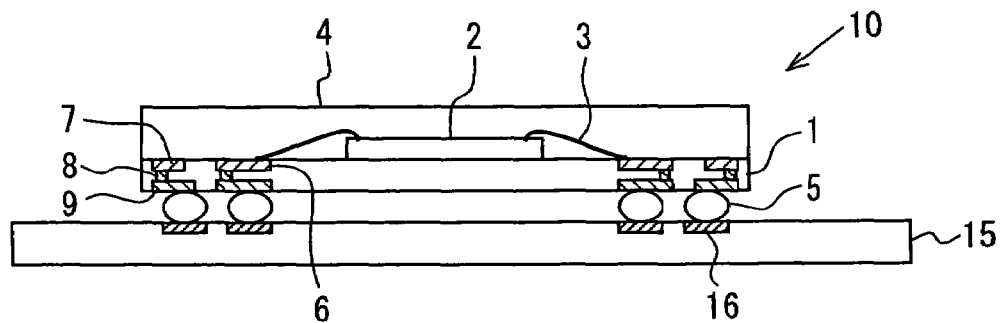
FIG. 1 is a cross sectional view showing a ball grid array according to an example embodiment.

FIG. 1 is a sectional view for schematically showing a structure of a ball grid array 10 according to an example embodiment.

As indicated in FIG. 1, the ball grid array 10 is constituted by an interposer 1, a semiconductor chip 2, wires 3, a resin mold 4, solder balls 5 functioning as ball terminals, and the like. The ball grid array 10 is mounted on a printed board 15 functioning as a main board via the solder balls 5.

Figure 2:
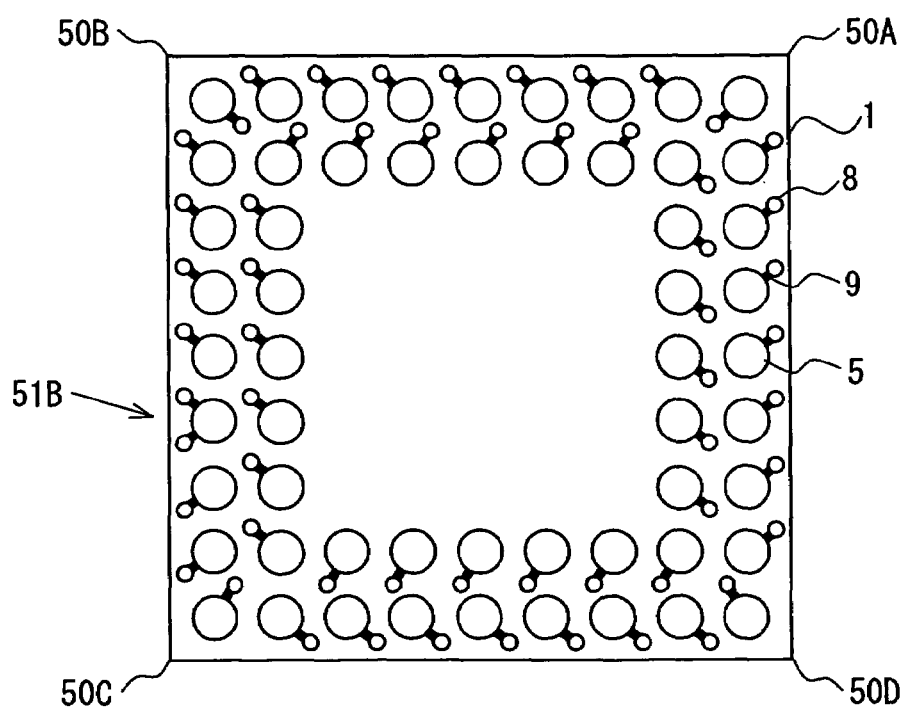
FIG. 2 is a plan view showing solder balls of an interposer.
Figure 3:
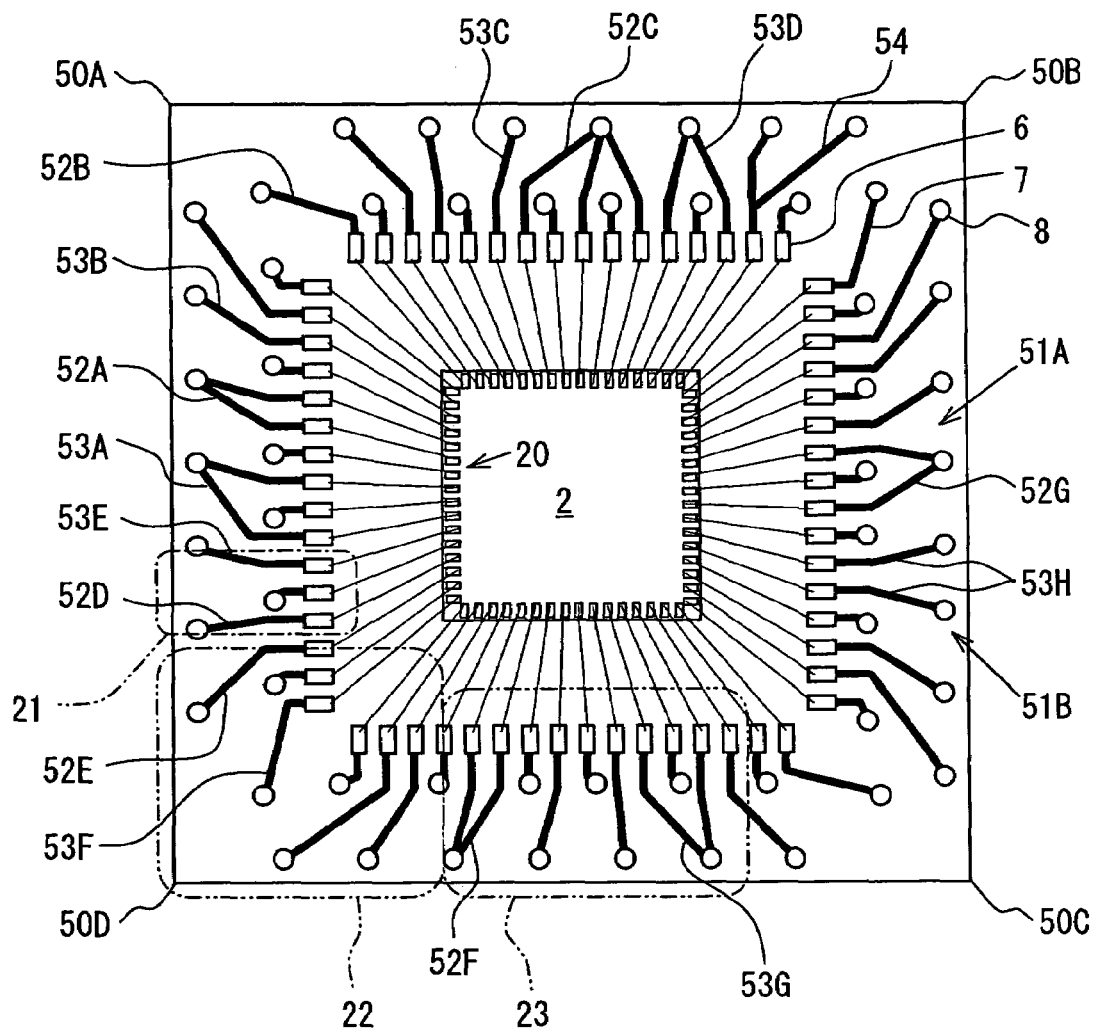
FIG. 3 is a plan view showing the interposer for mounting a semiconductor chip thereon.

In this case, FIG. 2 is a plan view for representing a plane of the ball grid array 10 on the side where the ball grid array 10 is mounted on the printed board 15, namely, a plan view for showing the plane of the interposer 1, on which the solder balls 5 have been formed. FIG. 3 is a plan view for representing a mounting plane of the interposer 1 for mounting the semiconductor chip 2. Referring properly to these drawings of FIG. 2 and FIG. 3, a description is made of the ball grid array 10. In FIG. 2, 50A to 50D represent four corners. In FIG. 3, 52A represents a ground (i.e., GND) for small current, 52B represents a GND for large current, 52C represents a GND for small current, 52D represents a GND for analog series, 52E represents a GND for five volts, 52F represents a GND for five volts, and 52GB represents a GND for one volt. Further, 53A represents a power supply for small current, 53B represents a power supply for large current, 53C and 53D represent power supplies for small current, 53E represents a power supply for analog, 53F represents a power supply for five volts, 53G represents a power supply for five volts, and 53H represents a power supply for one volt. Furthermore, 54 represents a significant signal wiring line.

As represented in FIG. 1 and FIG. 3, the semiconductor chip 2 fixed by employing, for instance, a die bonding material is mounted on one plane of the interposer 1. Furthermore, lands 6 and wiring patterns 7 connected to these lands 6 have been formed on the plane of the interposer 1, which mounts thereon the semiconductor chip 2.

As shown in FIG. 3, in the case that the semiconductor chip 2 is viewed from an upper direction, this semiconductor chip 2 is of a substantially rectangular shape. A plurality of pads 20 used to be connected to an external portion has been provided on an upper surface of the semiconductor chip 2 along respective edges of the rectangular shape. These plural pads 20 are electrically connected to the lands 6 formed on the semiconductor chip mounting plane of the interposer 1 by the wire-bonded wires 3.

Under such a condition that the semiconductor chip 2 has been mounted on the interposer 1 and the plurality of pads 20 have been electrically connected to the lands 6 by the wires 3, the resin mold 4 is formed on the semiconductor chip mounting plane of the interposer 1. As a consequence, the semiconductor chip 2, the wires 3, the wiring pattern 7, and the like are mold-sealed by employing the resin mold 4.

As indicated in FIG. 2, the solder balls 5 and wiring patterns 9 electrically connected to the solder balls 5 have been provided on a plane of the interposer 1 which is used to form the solder balls 5, and is an opposite-sided plane with respect to the semiconductor chip mounting plane thereof. Furthermore, penetrating vias 8 have been formed in the interposer 1, and these penetrating vias 8 reach from the mounting plane thereof for the semiconductor chip 2 to the forming plane thereof for the solder balls 5. While electric conducting members such as, for example, copper have been plated on inner peripheral planes of the penetrating vias 8, the wiring patterns 7 formed on the mounting plane for the semiconductor chip 2 are electrically connected to the wiring patterns 9 formed on the forming plane for the solder balls 5 by way of the above-explained electric conducting members.

It should be noted that in the example shown in FIG. 1 to FIG. 3, the wiring patterns 9 are provided on the forming plane for the solder balls 5, and the solder balls 5 are connected via the wiring patterns 9 to the electric conducting members within the penetrating vias 8. Alternatively, the solder balls 5 may be provided on the penetrating vias 8, so that the wiring patterns 9 may be omitted.

Lands 16 have been formed on positions of the printed board 15, and these positions correspond to the respective solder balls 5. The solder balls 5 and the lands 16 are heated by way of a reflow step, or the like so as to connect these members to each other, so that the ball grid array 10 is fixed on the printed board 15.

In accordance with the present embodiment mode, in the ball grid array 10 having the above-described structure, the wiring patterns 7 and 9 formed on both the planes of the interposer 1 are contrived in various manners. As a result, a total number of the above-explained solder balls 5 can be reduced, and also, it is possible to reduce that noise may mutually give adverse influences to other wiring lines. A detailed explanation thereof is made as follows.

In the semiconductor chip 2 of the present embodiment mode, various sorts of function circuits such as communication circuits, input/output circuits, A/D converting circuits, and logic circuits have been manufactured in an integrated form in order to accept multi-functional requests and high functional requests. As a result, in correspondence with a power supply and the ground (GND) which are provided for each of these function circuits, the plural pads 20 of the semiconductor chip 2 contain a large number of power supply-purpose pads and also a large quantity of GND-purpose pads.

As a consequence, in the ball grid array 10 according to the present embodiment modes, the solder balls 5 which are employed as the power supply-purpose terminals and the GND-purpose terminals in the interposer 1 are connected as common solder balls to at least two pieces of the above-described pads 20 which are employed as either the power supply-purpose pads or the GND-purpose pads in the semiconductor chip 2. As a result, a total number of these solder balls 5 can be decreased, as compared with a total number of these pads 20 of the semiconductor chip 2, so that the ball grid array 10 can be made compact.

In order that at least two pieces of the pads 20 employed as either the power supply-purpose pads or the GND-purpose pads are connected to the common solder balls 5, as indicated as a pattern 51A in FIG. 3, among the wiring patterns 7 formed on the mounting plane for the semiconductor chip 2, the respective wiring patterns elongated from the lands 6 which are connected to at least two pieces of the pads 20 may be merely connected to the common penetrating vias 8 which are connected to the common solder balls 5. Otherwise, as indicated as another pattern 51B in FIG. 2 and FIG. 3, while the wiring lines from at least two pieces of the pads 20 are separately connected to the individual penetrating vias 8, these individual penetrating vias 8 may be connected to the common solder balls 5 by the wiring patterns 9.

Figure 4:
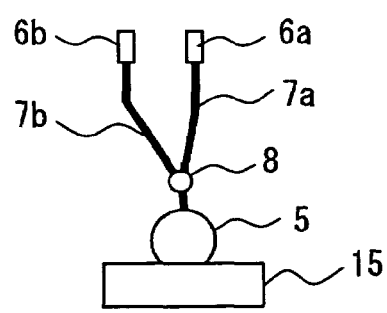
FIG. 4 is a diagram showing a wiring path in a first pattern, which connects lands to a common solder ball when the lands correspond to at least 2 pieces of pads employed as either power supply-purpose pads or GND-purpose pads.

FIG. 4 schematically indicates wiring paths from lands 6a and 6b to the common solder ball 5, while the lands 6a and 6b correspond to at least two pieces of the pads 20 which are employed as either the power supply-purpose pads or the GND-purpose pads in accordance with the above-described pattern 51A. In the case of this pattern 51A, wiring lines 7a and 7b elongated from these two lands 6a and 6b respectively are connected to the common penetrating via 8. As a result, a total number of the penetrating vias 8 may also be reduced in addition to that of the solder balls 5, so that the effective wiring patterns may be realized.

It should also be noted that both power supplies and power supply series of GNDs may have such a probability that, for instance, a potential is varied due to operation of a function circuit, and furthermore, noise is superimposed due to a high frequency signal by the function circuit. If the noise is produced in one power supply series connected to the common solder balls 5, then the produced noise may give an adverse influence also to the other power supply series.

As a consequence, in the pattern 51A shown in FIG. 4, the wiring patterns 7 and 9, and also, the electric conducting member within the penetrating via 8 are formed in such a manner that an impedance of a wiring path defined up to the penetrating via 8 corresponding to such a place that the wiring lines 7a and 7b elongated from the lands 6a and 6b are connected to each other becomes higher than an impedance of another wiring path defined from the penetrating via 8 up to the common solder ball 5. As a result, even when noise is produced in one wiring line and the produced noise reaches to the connecting portion of both the power supply series, this noise may easily flow through the common solder ball 5 rather than routed to the wiring line of the other power supply series. As a consequence, such an operation that both the power supply series connected to the common solder ball 5 mutually give the adverse influences to each other can be effectively suppressed.

In order to satisfy the above-explained impedance relationship, for example, a width of the wiring pattern 9 may be made wider than that of the wiring pattern 7. The wiring path up to the connection portion where the pads 6a and 6b are connected to the wiring lines 7a and 7b is connected by the wiring pattern 7, whereas the wiring path from the penetrating via 8 up to the common solder ball 5 is connected by the wiring pattern 9. As a consequence, since the width of the wiring pattern 9 is made wider than that of the wiring pattern 7, a wiring impedance defined from the lands 6a and 6b up to the connection portion where the wiring lines 7a and 7b are connected to each other can be made higher than a wiring impedance defined from the penetrating via 8 up to the common solder ball 5.

It should also be understood that the electric conducting material formed on the inner peripheral plane of the penetrating via 8 presents an inductance component as the impedance, and there is a possibility that this impedance of the electric conducting material may become higher than that of the wiring patterns 7 and 9. It should also be noted that a length of the electric conducting member, which corresponds to a depth of the penetrating via 8, may be kept short, as compared with the lengths of the wiring patterns 7 and 9. As a consequence, the wiring impedance defined from the wiring line connection portion including the electric conducting member within the penetrated via 8 up to the common solder ball 5 may be kept sufficiently lower than the wiring impedance defined from the lands 6a and 6b upon to the wiring connection portion.

Figure 5A:
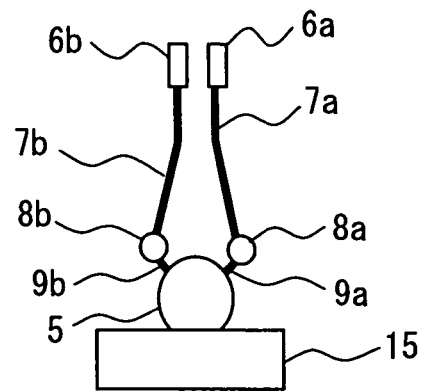
FIG. 5A is a diagram showing a wiring path in a second pattern, which connects lands to a common solder ball when the lands correspond to at least 2 pieces of pads employed as either power supply-purpose pads or GND-purpose pads.
Figure 5B:
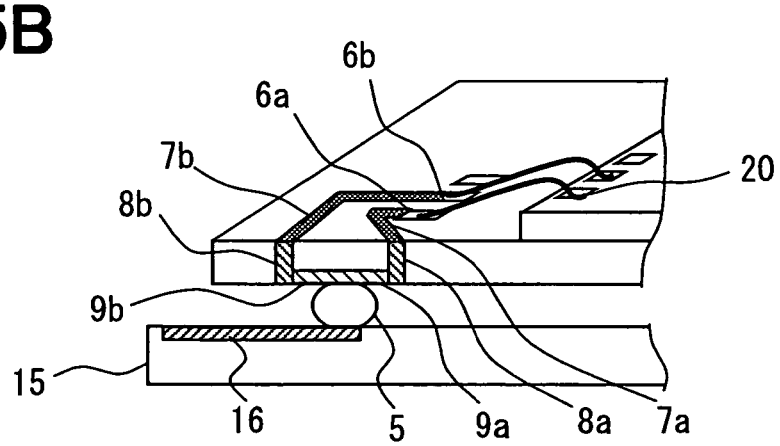
FIG. 5B is a partially sectional and perspective view showing the wiring path.

FIG. 5A schematically indicates wiring paths from lands 6a and 6b to the common solder ball 5, while the lands 6a and 6b correspond to at least two pieces of the pads 20 which are employed as either the power supply-purpose pads or the GND-purpose pads in accordance with the above-described pattern 51B. FIG. 5B is a partially sectional perspective view for more concretely representing the above-described wiring paths. In the case of this pattern 51B, the wiring lines 7a and 7b elongated from two pieces of the lands 6a and 6b are connected to the individual penetrating vias 8a and 8b, a wiring efficiency of the pattern 51B is lower than that of the pattern 51A.

Figure 5C:
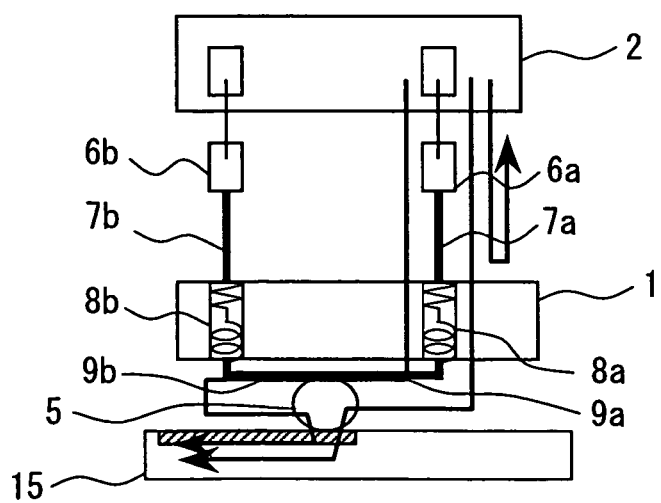
FIG. 5C is an explanatory diagram explaining the reason why entering of noise can be more firmly prevented.

However, in the pattern 51B, the common solder ball 5 is connected to the lands 6a and 6b by the wiring lines 9a and 9b which are branched from the common solder ball 5 and are elongated therefrom on the forming plane for the solder ball 5. As a result, this pattern 51B can have a merit that durability with respect to noise can be improved, as compared with the above-explained pattern 51A. As previously explained, the electric conducting member formed within the penetrating via 8 has a higher impedance than the impedances of the wiring patterns 7 and 9. Also, the lengths of the wiring lines from the common solder ball 5 up to the respective lands 6a and 6b become long, while the common solder ball 5 constitutes the branching point. Therefore, for example, as indicated by arrows in FIG. 5C, even when noise is produced in the wiring line 7a, the produced noise cannot pass through the electric conducting member of the penetrating via 8a. Also, even in such a case that this produced noise passes through the electric conducting member of the penetrating via 8a, entering of the noise into the wiring line 7b may be blocked by the electric conducting member formed in the penetrating via 8b which is continued to the wiring line 7b. In accordance with the above-explained manner, in the case of the pattern 51B, in the power supply series connected to the common solder ball 5, the mutual influence caused by the noise can be more firmly reduced, as compared with that of the pattern 51A.

Since the above-explained pattern 51A or pattern 51B is employed, at least two pieces of the pads 20 which are employed as either the power supply-purpose pads or the GND (ground)-purpose pads in the semiconductor chip 2 can be connected to the common solder balls 5 which are employed as either the power supply-purpose terminals or the GND-purpose terminals.

It should be understood that when at least two pieces of the pads 20 which are employed as either the power supply-purpose pads or the GND-purpose pads are connected to the common solder balls 5, the below-mentioned connecting way should be avoided: That is, it should avoid that either power supply-purpose pads are connected to each other or GND-purpose pads are connected to each other without conducting any restriction, while these power supply-purpose pads and GND-purpose pads are arbitrarily selected. The reason of this connecting way will now be explained.

Depending upon function circuits which are integrated in the semiconductor chip 2, there are some cases that operating voltages thereof are different from each other, and/or amounts of currents flowing through power supplies and the GNDs are different from each other. As a consequence, in such a case, while considering adverse influences given to operations of the respective function circuits, it is preferable to select such power supply-purpose pads and GND-purpose pads, the operating voltages and current amounts of which are approximated to each other as being permitted as possible, and to connect these selected pads to the common solder ball 5.

More specifically, in the case that amounts of supplied currents are different from each other in a plurality of power supply-purpose pads and a plurality of GND-purpose pads, the following connecting way is preferably employed. That is, while the power supply-purpose pads and the GND-purpose pads through which relatively large currents are supplied are connected to the individual solder balls 5, the power supply-purpose pads and/or the GND-purpose pads through which relatively small currents are supplied are mutually connected to the common solder ball 5. As a result, in the plural power supply-purpose pads and the plural GND-purpose pads, the current supplying amounts of the respective pads can be made equal to each other. Also, when the current supply amounts in the power supply-purpose pads and the GND-purpose pads are relatively small, even if these pads are connected to the common solder ball 5, a total amount of current supplying amounts in the common solder ball 5 never becomes excessively large. As a consequence, voltage drops caused by the impedance in the wiring paths become very low, so that proper operating voltages can be applied to the respective function circuits.

The wiring lines in the power supplies 53A to 53D and the GNDs 52A to 52C in FIG. 3 have been formed by considering the above-explained current supplying amounts. In other words, as to the power supply 53A and the GND 52A, two sets of power supply-purpose pads are connected to each other by the wiring pattern 7, and two sets of GND-purpose pads are connected to each other by the wiring pattern 7, the current supplying amounts of which are relatively small. On the other hand, as to the power supply 53B and the GND 52B, since the pads are such a power supply-purpose pad and a GND-purpose pad whose current supplying amounts are relatively large, these pads are wired in such a manner that these pads are connected to the single solder balls 5 respectively. Also, as to the GND 52C, three pieces of GND-purpose pads through which relatively small currents are supplied are connected to the common penetrating via 8 by the wiring patterns 7. As previously explained, a total number of either the power supply-purpose pads or the GND-purpose pads need not be limited only to 2 pieces, but may be 3, or more pieces, while these pads are connected to the common solder ball 5. It should also be noted that as to the power supplies 53C, 53D, while considering such a fact that the positions of the 3 power supply-purpose pads are separated from each other, these power supplies 53C, 53D are subdivided into a power supply 53C and another power supply 53D. In the power supply 53C, one piece of the power supply-purpose pad is connected to one piece of the solder ball 5. In the power supply 53D, two pieces of the power supply-purpose pads are connected to the common solder ball 5.

Also, while in addition to the current supplying amount, for instance, noise producing amounts of the respective power supply series are considered, power supply-purpose pads and GND-purpose pads which are connected to each other may be alternatively selected. In other words, among the plurality of power supply-purpose pads and/or the plurality of GND-purpose pads, such power supply-purpose pads whose noise producing amounts are relatively small are mutually connected to the common solder ball 5, and/or a plurality of such GND-purpose pads whose noise producing amounts are relatively small are mutually connected to the common solder ball 5. With employment of this connecting structure, the noise producing amounts may be equalized between the above-explained pads whose noise producing amounts are relatively small, and both a power supply-purpose pad and a GND-purpose pad whose noise producing amounts are relatively large. Also, since the above-explained power supply-purpose pad and GND-purpose pad whose noise producing amounts are relatively large are excluded from the connection subjects to the common solder ball 5, it is possible to avoid that the noise is propagated from the above-explained power supply-purpose pad and GND-purpose pad whose noise producing amounts are relatively large to other power supply-purpose pads and GND-purpose pads. Also, it is possible to avoid that the noise producing amount becomes excessively large by adding the noise with each other.

There are many cases that as power supply series whose noise producing amounts are relatively large, the below-mentioned power supplies and the GNDs correspond thereto. That is, these power supplies are employed for a circuit such as a CPU operable in a high-speed communication circuit, a digital-series signal output circuit, and the like. There are many cases that as power supply series whose noise producing amounts are relatively small, the below-mentioned power supplies and the GNDs correspond thereto. That is, these power supplies are employed for an analog series circuit, a low-speed communication circuit, a circuit through which a constant current flows under stationary condition, and the like.

Also, as shown in FIG. 3, the plural function circuits provided within the semiconductor chip 2 contain an analog series circuit 21 for processing an analog signal, and digital series circuits 22 and 23 for processing digital signals, the following connecting way is preferably employed. That is, while both a power supply-purpose pad and a GND-purpose pad of the analog series circuit 21 may be connected to the individual solder balls 5, power supply-purpose pads and/or GND-purpose pads provided in the digital series circuit 23 may be mutually connected to the common solder ball 5.

As previously explained, if power supply-purpose pads and GND-purpose pads are mutually connected to the common solder ball 5, then there are some possibilities that noise may mutually give influences with each other in both power supply series. In this case, in the analog series circuit 21, analog signal waveforms themselves constitute subjects to be processed. For instance, when a power supply voltage and a reference voltage of an A/D converting circuit are varied by noise entered to a power supply series, there are large possibilities that a large error may be contained in an A/D conversion result obtained at this time. As a consequence, as to the power supply 4 and the GND 52D of the analog series circuit 21, it is desirable that the power supply-purpose pad and the GND-purpose pad are connected to the individual solder balls 5 so as to be separated from other power supply series.

On the other hand, in the digital series circuit 23, since a process operation is carried out based upon a digital signal indicative of either "1" or "0", even when noise is produced in a power supply series, an adverse influence caused by this noise is small. Accordingly, as to the power supply 53G and the GND 52F of the digital series circuit 23, the plurality of power supply-purpose pads and the plurality of GND-purpose pads have been mutually connected to the common solder balls 5 respectively.

It should also be understood that when the semiconductor chip 2 contains the analog series circuit 21 and the digital series circuits 22 and 23, the below-mentioned connection ways must be avoided in maximum. That is, it should be avoided that since the power supply-purpose pads provided in the analog series circuit 21, and the power supply-purpose pads provided in the digital series circuits 22 and 23 are connected to the common solder ball 5, or since the GND-purpose pads provided in the analog series circuit 21, and the GND-purpose pads provided in the digital series circuits 22 and 23 are connected to the common solder ball 5, the analog series circuits are mixed with the digital series circuits.

Also, in the example shown in FIG. 3, in the digital series circuits 22 and 23, only as to the digital series output unit 23 which outputs a digital signal to an external circuit, the power supply-purpose pads and the GND-purpose pads are mutually connected to the common solder balls 5. In other words, with respect to the digital series input part 22 into which the digital signal is inputted from the external circuit, either the plural power supply-purpose pads or the plural GND-purpose pads are not connected to the common solder balls 5.

Since a digital signal indicative of either "0" or "1" is used so as to be processed, the digital series circuits 22 and 23 can be hardly influenced by noise in principle. However, in the digital series input unit 22, a binary process operation of a signal is carried out based upon a level of an entered digital signal, so that an adverse influence caused by noise becomes large, as compared with that of the digital series output unit 23. As a consequence, it is preferable that the mutual connections of the power supply-purpose pads, and the mutual connections of the GND-purpose pads are carried out at a top priority in the digital series output circuit 23.

As previously explained, when the plural power supply-purpose pads and the plural GND-pads are connected to the common solder balls 5, a total number of these solder balls 5 which are required to connect the ball grid array 10 can be reduced. As a result, since there is a spare in the number of solder balls 5, as shown in FIG. 3, in particular, an important signal wiring line used to transfer an important signal is connected to the plural penetrating vias 8 and the plural solder balls 5, so that transfer paths of this important signal may be multiplexed.

As represented as the above-described pattern 51A, in the case that the plurality of power supply-purpose pads and the plurality of GND-purpose pads are connected through the common penetrating via 8 by the wiring lines 7a and 7b to the common solder ball 5, it is preferable to set the array of the pads of the semiconductor chip 2 and the wiring patterns 7 in such a manner that a wiring line used to transfer a significant signal is surrounded by these wiring lines 7a and 7b on the mounting plane for the semiconductor chip 2.

For instance, the wiring line used so as to transfer such a signal which may easily become a noise source as an oscillation signal as the significant signal is surrounded by the wiring lines 7a and 7b which are connected to the common solder ball 5 and become the same potentials to each other. As a result, the wiring lines 7a and 7b may own a shielding role with respect to the signal which may easily become the noise source. In other words, it is possible to avoid that the noise goes over the wiring lines 7a and 7b and then is propagated to other wiring lines from the wiring line for transferring the signal which may readily become the noise source, while the wiring lines 7a and 7b are maintained at the same potentials and surround the above-explained transferring wiring line. It should also be noted that such a wiring line may be alternatively surrounded by the wiring lines 7a and 7b connected to the common solder ball 5, while this wiring line may be used to transfer a signal as a significant signal, from which the adverse influence by the noise is wanted to be eliminated as much as possible.

As previously explained, in FIG. 3, several examples have been indicated in which the wiring lines 7a and 7b for connecting paths between either two, or more pieces of power supply-purpose pads or GND-purpose pads and the common solder balls 5 have been formed in such a way that these wiring lines 7a and 7b surround wiring lines used so as to transfer significant signals.

As indicated in FIG. 3, when a wiring line for transferring a significant signal is surrounded by the wiring lines 7a and 7b, it is preferable that such a penetrating via 8 to which these wiring lines 7a and 7b is formed at a position separated from the semiconductor chip 2 rather than another penetrating via 8 to which the above-explained wiring line of the significant signal is connected. As a result, when the wiring line of the significant signal is surrounded by the wiring lines 7a and 7b, the entire length of the wiring line is no longer prolonged.

Figure 6:
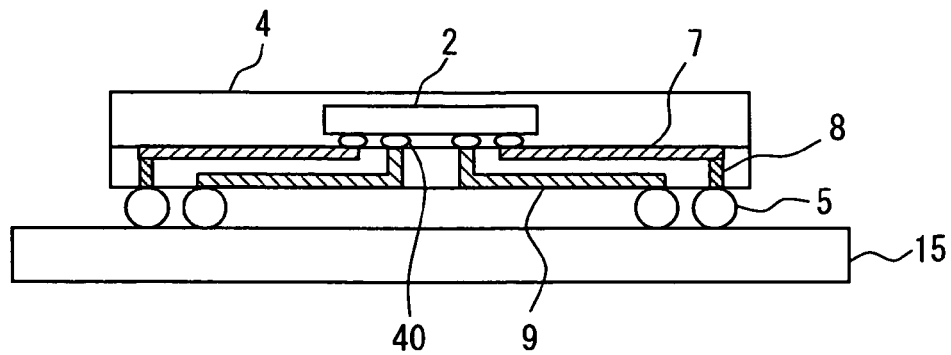
FIG. 6 is a cross sectional view showing a modification in which a ball grid array has been mounted on a surface of an interposer.

While FIG. 1 to FIG. 3 indicate certain examples that the pads 20 of the semiconductor chip 2 are electrically connected to the lands 6 of the interposer 1 through wire bonding, FIG. 6 shows another example that the semiconductor chip 2 may be alternatively mounted via ball terminals 40 in a flip-chip mounting manner with respect to the interposer 1 (surface-mounted).

When this flip-chip mounting manner is employed, a plurality of pads are provided on 2 columns made of an inner peripheral-sided column and an outer peripheral-sided column on the surface of the semiconductor chip 2, and also, lands 6 are arrayed on 2 columns made of an inner peripheral-sided column and an outer peripheral-sided column on the mounting plane of the interposer 1 for the semiconductor chip 2 in correspondence with these plural pads.

Figure 7:
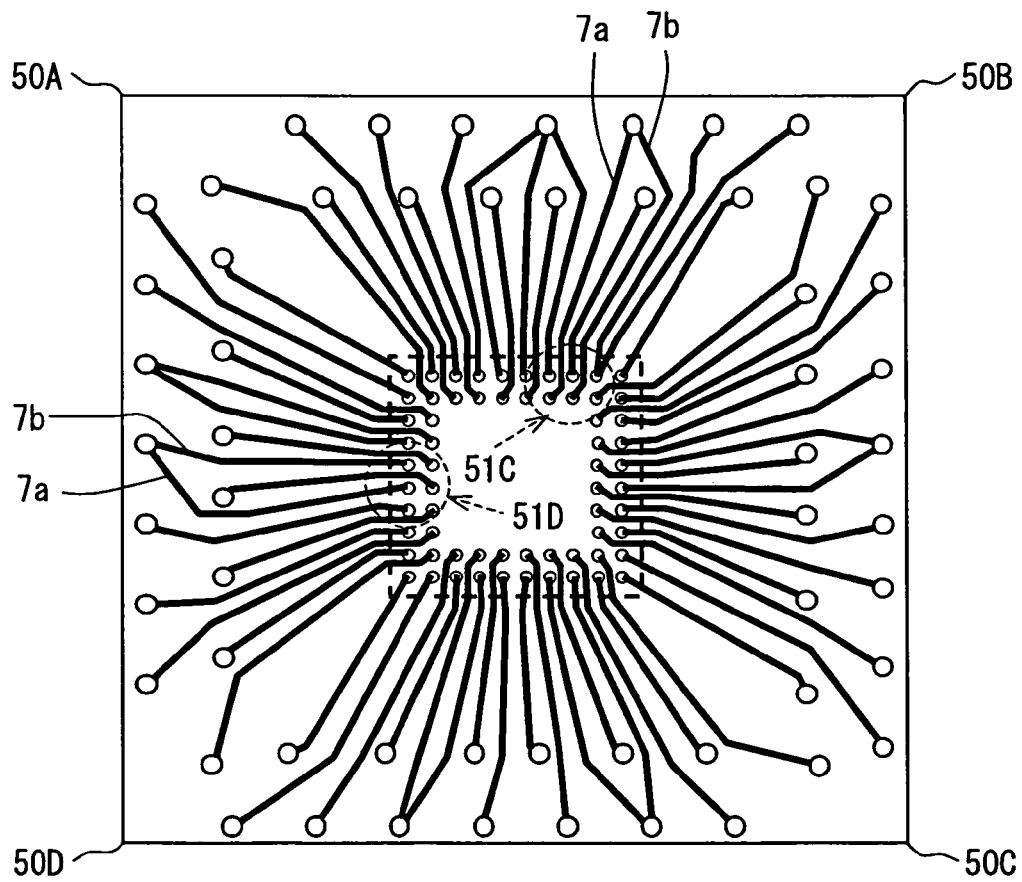
FIG. 7 is a plan view showing the interposer for mounting a semiconductor chip in the modification shown in FIG. 6.

FIG. 7 indicates an interposer 1 in which lands 6 have been arrayed on 2 columns made of inner and outer peripheral-sided columns, and wiring patterns have been formed which are connected to the respective lands 6. In the case that the interposer 1 uses such arrays of the lands 6, it is preferable to arrange that as represented by a pattern 51C of FIG. 7, the wiring lines 7a and 7b which are connected to the common solder ball 5 are connected to the inner peripheral-sided lands 6, whereas a wiring line for transferring a significant signal is connected to the outer peripheral-sided land 6. As a consequence, the wiring lines 7a and 7b across an edge portion of the wiring line for the significant signal on the side of the semiconductor chip 2, and then are elongated toward the center of the semiconductor chip 2. As a result, the wiring line for the significant signal can be more firmly guarded. In other words, as indicated by a pattern 51D of FIG. 7, if the wiring line for the significant signal is elongated toward the center of the semiconductor chip 2 rather than the edges of the wiring lines 7a and 7b, then there are great possibilities that noise may be propagated from this elongated portion to other wiring lines.

The method for connecting at least two pieces of the pads 20 to the common solder ball 5 has been explained, while these two pads 20 are employed as either the power supply-purpose pads or the GND-purpose pads. In the case that a plurality of power supply series are mutually connected to each other in the above-explained manner, even when an abnormal event such as a line disconnection happens to occur in one power supply series, there is a risk that this abnormal event can be hardly detected.

Figure 8:
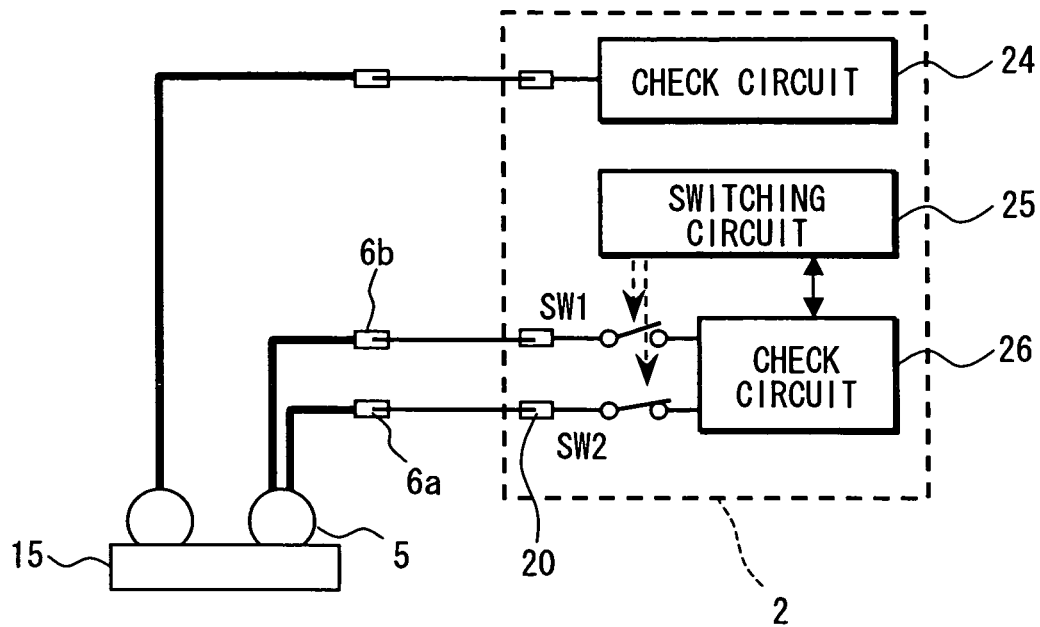
FIG. 8 is a circuit diagram indicating a first circuit for separately checking as to whether or not an abnormal event such as a line disconnection occurs in the wiring lines connected to the common solder ball.
Figure 9:
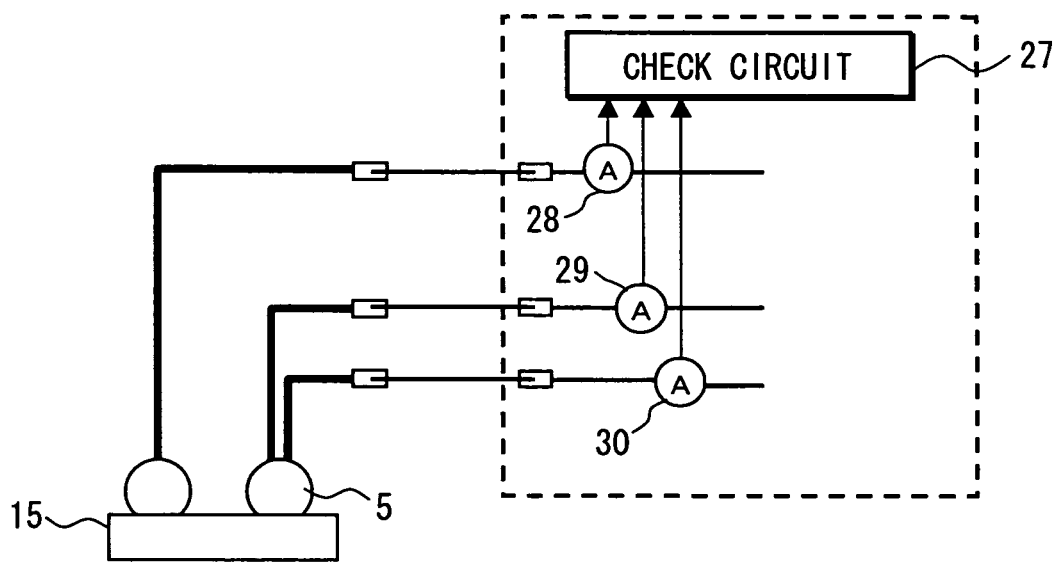
FIG. 9 is a circuit diagram indicating a second circuit for separately checking as to whether or not an abnormal event such as a line disconnection occurs in the wiring lines connected to the common solder ball.

As a consequence, it is preferable to arranged that, for example, circuits indicated in FIG. 8 and FIG. 9 are integrated in the semiconductor chip 2 in order to separately check as to whether or not such an abnormal event as a line disconnection occurs in the wiring lines 7a and 7b which are connected to the common solder ball 5.

In the circuit shown in FIG. 8, switches SW1 and SW2 have been provided in wiring paths within the semiconductor chip 2, while these wiring paths are connected to 2 pieces of the pads 20 connected to the common solder ball 5. These switches SW1 and SW2 are separately switched to closed states and opened states respectively by a switching circuit 25. In other words, when the semiconductor 2 is operated, the switching circuit 25 brings both the switches SW1 and SW2 into closed states, so that an operating voltage can be applied to a function circuit, whereas when a conducting state is checked, the switching circuit 25 sequentially switches the switches SW1 and SW2 into a closed state one by one. A conducting check circuit 26 judges as to whether or not a conducting state is normal based upon a potential level of each of the wiring paths when the respective switches SW1 and SW2 are closed while a predetermined potential is applied thereto from an external source. It should also be noted that the conducting check circuit 24 has also been provided with a pad 20 other than the pad 20 connected to the common solder ball 5.

In the circuit indicated in FIG. 9, current detecting circuits 28 to 30 have been provided in the respective wiring paths within the semiconductor chip 2. Then, when electric power is supplied to the respective pads from an external source, so that currents are supplied to the respective wiring paths, current values of the currents flowing through the respective wiring lines are detected by the current detecting units 28 to 30. The conducting check circuit 27 judges as to whether or not a conducting status is normal for each of these wiring paths based upon the detected current value.

In the above-described circuit shown in FIG. 8, when the semiconductor chip 2 is operated, the switches SW1 and SW2 are brought into the closed states. As a result, timing when a conducting status can be checked is limited only to such a timing before a product as a ball grid array is shipped, and also, another timing when this ball grid array is mounted on a main board. However, in accordance with the circuit shown in FIG. 9, since the current values of the currents flowing through the respective wiring paths are monitored, even when the main board equipped with the ball grid array is brought into such a condition that this main board is employed to control a certain appliance to be controlled, the above-described circuit of FIG. 9 can check conducting statuses of the respective paths.

The above disclosure has the following aspects.

According to an aspect of the present disclosure, a ball grid array includes: a semiconductor chip having a plurality of pads; and an interposer for mounting the semiconductor chip on a first surface of the interposer. The interposer includes a plurality of wirings disposed on the first surface and a plurality of ball terminals disposed on a second surface, which is opposite to the first surface. Each wiring is connected to a corresponding pad of the semiconductor chip, and is electrically connected to a corresponding ball terminal. At least one of ball terminals providing a power supply terminal or a ground terminal provides a common ball terminal for connecting to at least two of the pads of the semiconductor chip through two wirings.

In order to respond to multi-functional requests and high functional requests, there is a trend that various sorts of function circuits such as communication circuits, input/output circuits, A/D converting circuits, and logic circuits are manufactured in semiconductor chips in an integrated circuit form. To this end, there are some cases that a large number of power supply-purpose pads and a large number of GND-purpose pads are provided in correspondence with the respective function circuits. In the above ball grid array, such a technical point is considered. That is to say, at least one piece of a ball terminal which is employed as either a power supply-purpose terminal or a GND-purpose terminal in an interposer is connected as a common ball terminal to at least two pieces of pads containing such pads which are employed as either power supply-purpose pads or GND-purpose pads in a semiconductor chip. As a result, a total number of the ball terminals can be decreased, as compared with a total number of the pads of the semiconductor chip, so that the ball grid array can be made compact.

Alternatively, the semiconductor chip may further include a plurality of functional circuits. Each functional circuit has a power supply and a ground. The pads include a plurality of power supply pads and a plurality of ground pads, which correspond to the power supplies and the grounds in the functional circuits, respectively. The power supply pads are commonly connected to a first common ball terminal and/or the ground pads are commonly connected to a second common ball terminal. In the case that the semiconductor chip includes a plurality of function circuits; at least 1 set of a power supply and the GND (ground) is provided for each of the function circuits; the plurality of pads contain a plurality of power supply-purpose pads and a plurality of GND-purpose pads in correspondence with the plurality of power supplies and the plurality of GNDs, the plurality of power supply-purpose pads and/or the plurality of GND-purpose pads may be preferably and mutually connected to the common ball terminal. This is because the power supply and the GND can be commonly used by different function circuits.

Alternatively, the semiconductor chip may further include a plurality of functional circuits. Each functional circuit has a power supply and a ground. The pads include a plurality of power supply pads and a plurality of ground pads, which correspond to the power supplies and the grounds in the functional circuits, respectively. The power supply pads include a plurality of small current power supply pads, each of which is capable of flowing a current smaller than a predetermined current. The ground pads include a plurality of small current ground pads, each of which is capable of flowing a current smaller than the predetermined current. The small current power supply pads are commonly connected to a first common ball terminal and/or the small current ground pads are commonly connected to a second common ball terminal. There are some possibilities that operating voltages are different from each other, voltages and amounts of currents flowing through GNDs are different from each other, depending upon function circuits. In such a case, it is preferable that power supply-purpose pads and/or GND-purpose pads whose operating voltages and current amounts are approximated to each other are selected as close as possible by considering adverse influences given to operations of the respective function circuits, and then, are connected to the common ball terminal. In the above array, among the plurality of power supply-purpose pads and/or the plurality of GND-purpose pads, power supply-purpose pads whose current supplying amounts are relatively small, and/or a plurality of GND-purpose pads may be preferably connected to the common ball terminal. Since the power supply-purpose pads whose current supplying amounts are relatively small, and/or a plurality of GND-purpose pads are connected to the common ball terminal, the supply amounts of the currents may be equalized with respect to the power supply-purpose pads and the GND-purpose pads whose current supplying amounts are relatively large. Also, when the current supply amounts in the power supply-purpose pads and the GND-purpose pads are relatively small, even if these pads are connected to the common ball terminal, a total amount of current supplying amounts never becomes excessively large. As a consequence, voltage drops caused by the impedance in the wiring paths become very low, so that proper operating voltages can be applied to the respective function circuits.

Alternatively, the semiconductor chip may further include a plurality of functional circuits. Each functional circuit has a power supply and a ground. The pads include a plurality of power supply pads and a plurality of ground pads, which correspond to the power supplies and the grounds in the functional circuits, respectively. The power supply pads include a plurality of small noise power supply pads, each of which generates a noise smaller than a predetermined noise. The ground pads include a plurality of small noise ground pads, each of which generates a noise smaller than the predetermined noise. The small noise power supply pads are commonly connected to a first common ball terminal and/or the small noise ground pads are commonly connected to a second common ball terminal. In the above array, power supply-purpose pads whose noise producing amounts are relatively small, and/or a plurality of GND-purpose pads may be connected to the common ball terminal. With employment of this structure, the noise producing amounts may be equalized between the above-explained pads whose noise producing amounts are relatively small, and both a power supply-purpose pad and a GND-purpose pad whose noise producing amounts are relatively large. Also, since the above-explained power supply-purpose pad and GND-purpose pad whose noise producing amounts are relatively large are excluded from the connection subjects to the common solder ball, it is possible to avoid that the noise is propagated from the above-explained power supply-purpose pad and GND-purpose pad whose noise producing amounts are relatively large to other power supply-purpose pads and GND-purpose pads. Also, it is possible to avoid that the noise producing amount becomes excessively large by adding the noise with each other.

Alternatively, the semiconductor chip may further include a plurality of functional circuits. Each functional circuit has a power supply and a ground. The pads include a plurality of power supply pads and a plurality of ground pads, which correspond to the power supplies and the grounds in the functional circuits, respectively. The functional circuits further include an analog circuit for processing an analog signal and a plurality of digital circuits for processing a digital signal. The power supply pad corresponding to the power supply in the analog circuit is connected to one of the ball terminals. The ground pad corresponding to the ground in the analog circuit is connected to another ball terminal. The power supply pads corresponding to the power supplies in the digital circuits are commonly connected to a first common ball terminal, and/or the ground pads corresponding to the grounds in the digital circuits are commonly connected to a second common ball terminal. When either the power supply-purpose pads or the GND-purpose pads are mutually connected to the common ball terminal, for example, if noise is produced in one power supply series, then an adverse influence caused by this noise may be given to the other power supply series. In this case, in an analog series circuit, for instance, analog signal waveform itself such as an A/D conversion constitutes a subject to be processed, so that adverse influences caused by the noise with respect to a power supply voltage and a reference voltage are increased. As a consequence, in order to eliminate the adverse influences of the noise, it is preferable that a power supply-purpose pad and a GND pad used for the analog series circuit are connected to the individual ball terminals respectively so as to be separated from each other. On the other hand, in a digital series circuit, since a process operation is carried out based upon a digital signal indicative of either "1" or "0", even when noise is produced in a power supply series, an adverse influence caused by the this noise is small. Accordingly, it is preferable that either a plurality of power supply-purpose pads or a plurality of GND-purpose pads are mutually connected to a common ball terminal respectively. In particular, it should be avoided that the power supply-purpose pads provided in the analog series circuit, and the power supply-purpose pads provided in the digital series circuit are connected to the common ball terminal, the GND-purpose pads provided in the analog series circuit, and the GND-purpose pads provided in the digital series circuit are connected to the common ball terminal, the analog series circuits are mixed with the digital series circuits, as being permitted as possible.

Alternatively, the semiconductor chip may further include a plurality of functional circuits. Each functional circuit has a power supply and a ground. The pads include a plurality of power supply pads and a plurality of ground pads, which correspond to the power supplies and the grounds in the functional circuits, respectively. The functional circuits further include an analog circuit for processing an analog signal and a plurality of digital circuits for processing a digital signal. The power supply pad corresponding to the power supply in the analog circuit is connected to a first ball terminal among the ball terminals. The ground pad corresponding to the ground in the analog circuit is connected to a second ball terminal among the ball terminals. The digital circuits include an input circuit for inputting a digital signal from an external circuit and a plurality of output circuits for outputting the digital signal to the external circuit. The power supply pad corresponding to the power supply in the input circuit is connected to a third ball terminal among the ball terminals. The ground pad corresponding to the ground in the input circuit is connected to a fourth ball terminal among the ball terminals. The power supply pads corresponding to the power supplies in the output circuits are commonly connected to a first common ball terminal, and/or the ground pads corresponding to the grounds in the output circuits are commonly connected to a second common ball terminal. In the digital series circuit, an adverse influence caused by noise can be hardly given in principle. However, in an input unit for inputting a digital signal from an external source of this digital series circuit, a signal is binary-processed based upon the level of the inputted digital signal, so that an adverse influence caused by noise becomes large, as compared with that of an output unit for outputting a digital signal to the external source.

Alternatively, one of the pads may be disposed between the two of the pads, which are connected to the common ball terminal. The one of the pads is capable of transmitting a significant signal so that the one of the pads provides a significant signal pad. Two wirings connecting to the two of the pads surround one wiring connecting to the significant signal pad on the first surface of the semiconductor chip. For instance, the wiring line connected to a pad which is used so as to transfer an oscillation signal which may easily become a noise source as the significant signal is surrounded by the wiring lines which are connected to the common ball terminal and become the same potentials to each other. As a result, it is possible to avoid that the noise goes over the wiring lines which surround the wiring lines, and then is propagated to other wiring lines. Conversely, such a wiring line may be alternatively surrounded by the wiring lines connected to the common ball terminal, while this wiring line is connected to a pad used to transfer a signal as a significant signal, from which the adverse influence by the noise is wanted to be eliminated as much as possible.

Further, the interposer may further include a plurality of through holes penetrating the interposer from the first surface to the second surface. Each ball terminal and a corresponding wiring are connected through a conductive member in a corresponding through hole. The two wirings connecting to the two of the pads are commonly connected to a common conductive member in a common through hole. The one wiring connecting to the significant signal pad is connected to a significant signal conductive member in a significant signal through hole. A distance between the common through hole and the semiconductor chip is larger than a distance between the significant signal through hole and the semiconductor chip. In this case, the wiring line connected to the pad which is used so as to transfer the significant signal may be easily surrounded by the wiring lines connected to the common ball terminal.

Further, the pads may include inner side pads and outer side pads. The inner side pads are disposed inside of the semiconductor chip, and the outer side pads are disposed outside of the semiconductor chip. The semiconductor chip is mounted on the interposer in a flip-chip mount manner. The significant signal pad is one of the inner side pads. The two of the pads are two of the outer side pads. With employment of the above-described structure, the wiring lines which are connected to the common ball terminal across an edge portion of the wiring line for the significant signal on the side of the semiconductor chip, and then are elongated toward the center of the semiconductor chip. As a result, the wiring line for the significant signal can be more firmly guarded.

Alternatively, the interposer may further include a plurality of through holes penetrating the interposer from the first surface to the second surface. Each ball terminal and a corresponding wiring are electrically connected through a conductive member in a corresponding through hole. The interposer further includes a branch line disposed on the second surface. The branch line connects the common ball terminal and at least two conductive members in two through holes. The two of the pads are connected to the common ball terminal through the branch line and the two conductive members. The two of the pads are individually connected to the two conductive members through two wirings. In this case, since lengths of the wiring lines from the branching point to the respective pads are prolonged, even when noise is produced in one wiring line, this produced noise may readily flow into the common ball terminal, as compared with such a fact that this produced noise is routed to the other wiring line. As a result, it is possible to avoid such an event that the noise may mutually give influences to each other.

Alternatively, the interposer may further include a plurality of through holes penetrating the interposer from the first surface to the second surface. Each ball terminal and a corresponding wiring are electrically connected through a conductive member in a corresponding through hole. The two of the pads are connected to two wirings, respectively. The two wirings are commonly connected to a common conductive member in a common through hole. The common conductive member is connected to the common ball terminal so that the two of the pads are commonly connected to the common ball terminal. A first impedance between the two of the pads and a connection portion of the two wirings is larger than a second impedance between the connection portion and the common ball terminal. If such an impedance defined from the connection portion of the wiring lines up to the common ball terminal is smaller than another impedance defined from the connection portion up to each of the pads, even when this connection portion is provided on the mounting plane of the semiconductor chip, noise produced in one wiring line may readily flow into the common ball terminal, as compared with such a fact that this produced noise is routed to the other wiring line.

Alternatively, an electric passage between the two of the pads and the connection portion of the two wirings may have a first width. Another electric passage between the connection portion and the common ball terminal has a minimum width, which is larger than the first width. In this case, the impedance defined from the connection portion of the wiring lines up to the common ball terminal is made smaller than another impedance defined from the connection portion up to each of the pads.

Alternatively, the semiconductor chip may further include: a switching circuit for individually connecting and disconnecting two wiring passages disposed in the semiconductor chip, the two wiring passages being individually connected to the two of the pads; and a check circuit for individually checking conductivity of the two wiring passages when the switching circuit connects two wiring passages to the two of the pads one by one. Alternatively, the semiconductor chip may further include: a current supplying circuit for individually supplying a current to two wiring passages disposed in the semiconductor chip, the two wiring passages being individually connected to the two of the pads; a detecting circuit for detecting a current flowing through each wiring passage, respectively; and a check circuit for individually checking conductivity of the two wiring passages based on the current detected by the detecting circuit when the current supplying circuit supplies the current to the two wiring passages. In the above structures, even when 2, or more pieces of pads of the semiconductor chip are connected to the common ball terminal, it is possible to individually check the conducting statuses of the wiring paths up to the common ball terminal.

Alternatively, at least one of the pads capable of transmitting a significant signal is connected to a plurality of wirings on the first surface of the interposer. With employment of the above structure, a total number of the ball terminals required for connecting the ball grid array can be reduced. As a result, since there is a spare in the quantity of the ball terminals, for instance, as to an especially important signal, transfer paths of signals may be multiplexed.

While the invention has been described with reference to preferred embodiments thereof, it is to be understood that the invention is not limited to the preferred embodiments and constructions. The invention is intended to cover various modification and equivalent arrangements. In addition, while the various combinations and configurations, which are preferred, other combinations and configurations, including more, less or only a single element, are also within the spirit and scope of the invention.

What is claimed is:

1. A ball grid array comprising:
    a semiconductor chip having a plurality of pads; and
    an interposer for mounting the semiconductor chip on a first surface of the interposer,
    wherein the interposer includes a plurality of wirings disposed on the first surface and a plurality of ball terminals disposed on a second surface, which is opposite to the first surface,
    each wiring is connected to a corresponding pad of the semiconductor chip, and is electrically connected to a ball terminal, there being fewer ball terminals than pads, and
    at least one of ball terminals providing a power supply terminal, or a ground terminal, as a common ball terminal for connecting to at least two of the pads of the semiconductor chip through two of said wirings,
    wherein:
    the semiconductor chip includes a plurality of functional circuits,
    each functional circuit has a power supply and a ground,
    the pads include a plurality of power supply pads and a plurality of ground pads which respectively correspond to the power supplies and the grounds in the functional circuits, and
    the power supply pads are commonly connected to a first common ball terminal and/or the ground pads are commonly connected to a second common ball terminal.

2. The array according to claim 1, wherein:
    one of the pads is disposed between two of the pads which are connected to the common ball terminal,
    the one of the pads is capable of transmitting a significant signal so that the one of the pads provides a significant signal pad, and
    two wirings connecting to two of the pads surround one wiring connecting to the significant signal pad on the first surface of the semiconductor chip.

3. The array according to claim 2, wherein:
    the interposer includes a plurality of through holes penetrating the interposer from the first surface to the second surface,
    each ball terminal and a corresponding wiring are connected through a conductive member in a corresponding through hole,
    the two wirings connecting to two of the pads are commonly connected to a common conductive member in a common through hole,
    the one wiring connecting to the significant signal pad is connected to a significant signal conductive member in a significant signal through hole, and
    a distance between the common through hole and the semiconductor chip is larger than a distance between the significant signal through hole and the semiconductor chip.

4. The array according to claim 2, wherein:
    the pads include inner side pads and outer side pads,
    the inner side pads are disposed inside of the outer side pads on the semiconductor chip,
    the semiconductor chip is mounted on the interposer in a flip-chip mount manner,
    the significant signal pad is one of the inner side pads, and
    two of the pads are two of the outer side pads.

5. The array according to claim 1, wherein:
    the interposer includes a plurality of through holes penetrating the interposer from the first surface to the second surface,
    each ball terminal and at least one corresponding wiring are electrically connected through a conductive member in a through hole, the interposer includes a branch line disposed on the second surface, the branch line connects the common ball terminal and at least two conductive members in two through holes, two of the pads are connected to the common ball terminal through the branch line and the two conductive members, and two of the pads are individually connected to the two conductive members through two wirings.

6. The array according to claim 1, wherein:

the interposer includes a plurality of through holes penetrating the interposer from the first surface to the second surface, each ball terminal and at least one corresponding wiring are electrically connected through a conductive member in a through hole, two of the pads are respectively connected to two wirings, the two wirings are commonly connected to a common conductive member in a common through hole, the common conductive member is connected to the common ball terminal so that two of the pads are commonly connected to the common ball terminal, and a first impedance between two of the pads and a connection portion of the two wirings is larger than a second impedance between the connection portion and the common ball terminal.

7. The array according to claim 6, wherein:

an electric passage between two of the pads and the connection portion of the two wirings has a first width, and another electric passage between the connection portion and the common ball terminal has a minimum width, which is larger than the first width.

8. The array according to claim 1, wherein the semiconductor chip further includes:

a switching circuit for individually connecting and disconnecting two wiring passages disposed in the semiconductor chip, two wiring passages being individually connected to two of the pads; and a check circuit for individually checking conductivity of the two wiring passages when the switching circuit connects two wiring passages to two of the pads one by one.

9. The array according to claim 1, wherein the semiconductor chip further includes:

a current supplying circuit for individually supplying a current to two wiring passages disposed in the semiconductor chip, the two wiring passages being individually connected to two of the pads;

a detecting circuit for respectively detecting a current flowing through each wiring passage; and a check circuit for individually checking conductivity of the two wiring passages based on the current detected by the detecting circuit when the current supplying circuit supplies the current to the two wiring passages.

10. The array according to claim 1, wherein:

at least one of the pads is capable of transmitting a significant signal and is connected to a plurality of wirings on the first surface of the interposer.

11. A ball grid array comprising:

a semiconductor chip having a plurality of pads; and an interposer for mounting the semiconductor chip on a first surface of the interposer, wherein the interposer includes a plurality of wirings disposed on the first surface and a plurality of ball terminals disposed on a second surface, which is opposite to the first surface, each wiring is connected to a corresponding pad of the semiconductor chip, and is electrically connected to a ball terminal, there being fewer ball terminals than pads, and at least one of ball terminals providing a power supply terminal, or a ground terminal, as a common ball terminal for connecting to at least two pads of the semiconductor chip through two of said wirings, wherein:

the semiconductor chip includes a plurality of functional circuits, each functional circuit has a power supply and a ground, the pads include a plurality of power supply pads and a plurality of ground pads which respectively correspond to the power supplies and the grounds in the functional circuits, the power supply pads include a plurality of small current power supply pads, each of which is capable of flowing a current smaller than a predetermined current, the ground pads include a plurality of small current ground pads, each of which is capable of flowing a current smaller than the predetermined current, and the small current power supply pads are commonly connected to a first common ball terminal and/or the small current ground pads are commonly connected to a second common ball terminal.

12. A ball grid array comprising:

a semiconductor chip having a plurality of pads; and an interposer for mounting the semiconductor chip on a first surface of the interposer, wherein the interposer includes a plurality of wirings disposed on the first surface and a plurality of ball terminals disposed on a second surface, which is opposite to the first surface, each wiring is connected to a corresponding pad of the semiconductor chip, and is electrically connected to a ball terminal, there being fewer ball terminals than pads, and at least one of ball terminals providing a power supply terminal, or a ground terminal, as a common ball terminal for connecting to at least two pads of the semiconductor chip through two of said wirings, wherein:

the semiconductor chip includes a plurality of functional circuits, each functional circuit has a power supply and a ground, the pads include a plurality of power supply pads and a plurality of ground pads which respectively correspond to the power supplies and the grounds in the functional circuits, the power supply pads include a plurality of small noise power supply pads, each of which generates a noise smaller than a predetermined noise, the ground pads include a plurality of small noise ground pads, each of which generates a noise smaller than the predetermined noise, and the small noise power supply pads are commonly connected to a first common ball terminal and/or the small noise ground pads are commonly connected to a second common ball terminal.

13. A ball grid array comprising:

a semiconductor chip having a plurality of pads; and an interposer for mounting the semiconductor chip on a first surface of the interposer, wherein the interposer includes a plurality of wirings disposed on the first surface and a plurality of ball terminals disposed on a second surface, which is opposite to the first surface, each wiring is connected to a corresponding pad of the semiconductor chip, and is electrically connected to a ball terminal, there being fewer ball terminals than pads, and at least one of ball terminals providing a power supply terminal, or a ground terminal, as a common ball terminal for connecting to at least two pads of the semiconductor chip through two of said wirings, wherein:

the semiconductor chip includes a plurality of functional circuits, each functional circuit has a power supply and a ground, the pads include a plurality of power supply pads and a plurality of ground pads which respectively correspond to the power supplies and the grounds in the functional circuits, the functional circuits further include an analog circuit for processing an analog signal and a plurality of digital circuits for processing a digital signal, the power supply pad corresponding to the power supply in the analog circuit is connected to one of the ball terminals, the ground pad corresponding to the ground in the analog circuit is connected to another ball terminal, and the power supply pads corresponding to the power supplies in the digital circuits are commonly connected to a first common ball terminal, and/or the ground pads corresponding to the grounds in the digital circuits are commonly connected to a second common ball terminal.

14. A ball grid array comprising:

a semiconductor chip having a plurality of pads; and an interposer for mounting the semiconductor chip on a first surface of the interposer, wherein the interposer includes a plurality of wirings disposed on the first surface and a plurality of ball terminals disposed on a second surface, which is opposite to the first surface.

each wiring is connected to a corresponding pad of the semiconductor chip, and is electrically connected to a ball terminal, there being fewer ball terminals than pads, and at least one of ball terminals providing a power supply terminal, or a ground terminal, as a common ball terminal for connecting to at least two pads of the semiconductor chip through two of said wirings, wherein:

the semiconductor chip further includes a plurality of functional circuits, each functional circuit has a power supply and a ground, the pads include a plurality of power supply pads and a plurality of ground pads which respectively correspond to the power supplies and the grounds in the functional circuits, the functional circuits further include an analog circuit for processing an analog signal and a plurality of digital circuits for processing a digital signal, the power supply pad corresponding to the power supply in the analog circuit is connected to a first ball terminal among the ball terminals, the ground pad corresponding to the ground in the analog circuit is connected to a second ball terminal among the ball terminals, the digital circuits include an input circuit for inputting a digital signal from an external circuit and a plurality of output circuits for outputting the digital signal to the external circuit, the power supply pad corresponding to the power supply in the input circuit is connected to a third ball terminal among the ball terminals, the ground pad corresponding to the ground in the input circuit is connected to a fourth ball terminal among the ball terminals, and the power supply pads corresponding to the power supplies in the output circuits are commonly connected to a first common ball terminal, and/or the ground pads corresponding to the grounds in the output circuits are commonly connected to a second common ball terminal.

15. A semiconductor chip mounting assembly comprising:

a substrate having a first plurality of conductive lands arrayed on a first side, which lands respectively correspond to a like first plurality of conductive pads on a semiconductor chip to be mounted on the substrate;

said substrate having a second plurality of conductive ball terminals arrayed on a second side opposite said first side, said second plurality being less than said first plurality;

said substrate having conductive traces on said first and second sides and conductive vias passing through the substrate, each said conductive trace on the first side being connected between a respectively corresponding one of said conductive lands and at least one of said conductive vias and wherein at least one of said conductive vias is commonly connected to plurality of the conductive traces on the first side; and each said conductive trace on the second side being connected between at least one of said conductive vias and at least one of said conductive ball terminals.

16. An assembly as in claim 15, further comprising a semiconductor chip mounted on said first side and having each of said first plurality of conductive pads respectively electrically connected to a corresponding one of said first plurality of conductive lands.

17. An assembly as in claim 16, wherein a signal-carrying trace conductor is disposed between adjacent power supplying trace conductors on at least said first side of the substrate.

18. An assembly as in claim 16, wherein plural trace conductors on said first side of the substrate are used to supply similar magnitudes of power to respectively corresponding circuits in said chip and are connected in common to a single conductive via which is, in turn, connected to a single conductive ball terminal on said second side of the substrate.

19. An assembly as in claim 16, wherein:

said semiconductor chip includes test circuits separately connected to respectively corresponding ones of said conductive pads, said test circuits being capable of selectively testing for expected electrical connections and/or currents associated with said conductive lands, traces, vias and ball terminals on the substrate.

* * * * *